(12) United States Patent
Pan et al.

(10) Patent No.: US 6,529,321 B2
(45) Date of Patent: Mar. 4, 2003

(54) PROTECTIVE OVERCOAT FOR REPLICATED DIFFRACTION GRATINGS

(75) Inventors: Xiaojiang J. Pan, San Diego, CA (US); Richard G. Morton, San Diego, CA (US); Alexander I. Ershov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 72 days.

(21) Appl. No.: 09/731,938

(22) Filed: Dec. 7, 2000

(65) Prior Publication Data

US 2001/0003016 A1 Jun. 7, 2001

Related U.S. Application Data

(63) Continuation-in-part of application No. 08/939,611, filed on Sep. 29, 1997, now Pat. No. 6,162,495.

(51) Int. Cl.⁷ .............................. G02B 5/08; G02B 5/18
(52) U.S. Cl. ...................... 359/360; 359/571; 359/572; 359/576
(58) Field of Search ................................ 359/566, 569, 359/571, 572, 576, 360; 372/102

(56) References Cited

U.S. PATENT DOCUMENTS

| | | | | |
|---|---|---|---|---|
| 4,714,308 A | * | 12/1987 | Sawamura et al. | 359/360 |
| 5,042,887 A | * | 8/1991 | Yamada | 359/360 |
| 5,080,465 A | | 1/1992 | Laude | 359/571 |
| 5,436,764 A | | 7/1995 | Umetani et al. | 359/566 |
| 5,493,393 A | | 2/1996 | Beranek et al. | 356/328 |
| 5,850,309 A | * | 12/1998 | Shirai et al. | 359/360 |
| 5,995,285 A | * | 11/1999 | Unno | 355/53 |
| 6,101,211 A | * | 8/2000 | Wakabayashi et al. | 372/102 |

FOREIGN PATENT DOCUMENTS

| DE | 276740 A | * | 3/1990 | 359/576 |
|---|---|---|---|---|
| SU | 11631493 A | * | 2/1991 | 359/566 |
| WO | WO 96/31929 | * | 10/1996 | |

OTHER PUBLICATIONS

Georg Hass and Richard Tousey, "Reflecting Coatings for the Extreme Ultraviolet", J. Optical Soc. America, 49(6), pp 593–602, Jun. 1959.*

I.D. Torbin, et al., "The use of polymerizing cements for making replicas of optical surfaces", Sov. J. Optical Techn., 40(3), pp. 192–196, Mar. 1973.*

Bass, Michael (editor–in–chief)"HandbookOf Optics Vol. I, Fundamentals, Techniques, and Design", 2nd edition, Copyright 1995, pp. 42.3–42.54.

Maystre, D., Laude, J. P., Gacoin, P., Lepere, D. and Priou J. P., "Gratings for tunable lasers: using multidielectric coatings to improve their efficiency",Applied Optics, vol. 19(18)(Sep. 15, 1980); pp. 3099–3102.

* cited by examiner

Primary Examiner—John Juba, Jr.
(74) Attorney, Agent, or Firm—John R. Ross

(57) ABSTRACT

An overcoat protected diffraction grating. A replica grating having a thin aluminum reflective grating surface is produced by replication of a master grating or a submaster grating. The thin aluminum reflective surface may be cracked or have relatively thick grain boundaries containing oxides and hydroxides of aluminum and typically is also naturally coated with an aluminum oxide film. The grating is subsequently recoated in a vacuum chamber with a thin, pure, dense aluminum overcoat and then also in the vacuum the aluminum overcoat is coated with a thin film of $MgF_2$. The grating is especially suited for use for wavelength selection in an ArF laser operating producing an ultraviolet laser beam at a wavelength of about 193 nm. The oxygen free aluminum overcoat prevents the ultraviolet light from causing damage by stimulating chemical reactions in grating materials under the aluminum grating surface or in the aluminum oxide film. The $MgF_2$ additionally prevents oxidation on the surface, of the aluminum overcoat.

3 Claims, 8 Drawing Sheets

PROTECTIVE OVERCOAT FOR REPLICATED DIFFRACTION GRATINGS

This application is a continuation-in-part application of U.S. Ser. No. 08/939,611, filed Sep. 29, 1997 now U.S. Pat. No. 6,162,495. This invention relates to diffraction gratings and, in particular, to techniques used for improving performance extending the life of diffraction gratings.

FIELD OF THE INVENTION

BACKGROUND OF THE INVENTION

Diffraction gratings are frequently used in lasers for reflecting back into a laser's resonating cavity only a narrow range of wavelengths of light centered at one particular wavelength. Light energy at this wavelength resonates within the cavity and is emitted through a partially reflective mirror at the other end of the cavity. Examples of such diffraction gratings and various methods of making these diffraction gratings are described in U.S. Pat. Nos. 5,080,465; 5,436,764; and 5,493,393, incorporated herein by reference.

Typically, a master diffraction grating is first manufactured. This master grating is then used to form many replica gratings. Each of these replica gratings may then be used as a master grating for forming other replica gratings.

As described in the '465 patent, a master grating may be formed by depositing aluminum over a substrate, such as glass. A diamond tool under interferometric control may then be used to rule very closely spaced grooves in the aluminum layer. The separation of the grooves is related to the wavelength of the light to be reflected by the grating and to the narrowness of the range of wavelengths it is required to reflect. In one embodiment, the diamond tool rules on the order of tens of thousands of grooves per inch. The diffraction grating surface may be ten square inches and the grating one inch thick. Creating a precision master grating by physical ruling is, therefore, an extremely time consuming and expensive process.

Once a master grating has been made, replicas of the grating may be made using techniques such as are described in an article by Torbin and Wiskin in Soviet Journal of Optical Technology, Vol. 40(3) (March, 1973): 192–196. In one such method, a release agent, such as silver, gold, copper glycerine, carnuba wax, debutyphthalate or low vapor pressure oil is coated on the surface of the master. A thin (e.g., 1 micron) reflective layer, such as aluminum, is then deposited onto the release layer. An uncured polyester cement (epoxy) may then be deposited on the aluminum layers and a glass or metal substrate is then placed on top of the epoxy. After the cement is cured, the glass layer, epoxy layer, and aluminum layer are then separated from the master grating, resulting in a replica of the master grating.

Magnesium fluoride is a known optical coating. Coatings of this material having thicknesses of $\lambda/4$ are used to reduce unwanted reflections. Also $MgF_2$ coatings have been shown to improve the efficiency of gratings operating at wavelengths greater than about 500 to 600 nm. (See Maystre, et. al, Applied Optics, Vol. 19(18) (Sep. 15, 1980): 3099–3102. $Al_2O_3$ and $SiO_2$ are also well known coating materials.

One important use of replicated gratings is to line narrow excimer lasers producing ultraviolet light at wavelengths of 248 nm and 193 nm. Applicant has discovered that prior art replica gratings suffer substantial performance degradation when subject to intense ultraviolet radiation especially at the higher energy 193 nm wavelength. What is needed are replica gratings capable of long term high quality performance in intense ultraviolet radiation.

SUMMARY OF THE INVENTION

The present invention provides an overcoat protected diffraction grating. A replica grating having a thin aluminum reflective grating surface is produced by replication of a master grating or a submaster grating. The thin aluminum reflective surface may be cracked or have relatively thick grain boundaries containing oxides and hydroxides of aluminum and typically is also naturally coated with an aluminum oxide film. The grating is subsequently recoated in a vacuum chamber with a thin, pure, dense aluminum overcoat and then also in the vacuum the aluminum overcoat is coated with a thin protective layer. In a preferred embodiment this protective layer is a single layer of $MgF_2$. In another preferred embodiment the layer is a layer of $MgF_2$ covered with a layer of $Al_2O_3$ and in a third preferred embodiment the protective layer is made up of four alternating layers of $MgF_2$ and $Al_2O_3$. The thin protective layer not only protects the aluminum from ultraviolet caused degradation but also improves the normal reflectivity of the reflecting faces of the grating. The grating is especially suited for use for wavelength selection in an ArF laser operating producing an ultraviolet laser beam at a wavelength of about 193 nm. The oxygen free aluminum overcoat prevents the ultraviolet light from causing damage by stimulating chemical reactions in grating materials under the aluminum grating surface or in the aluminum oxide film.

DETAILED DESCRIPTION OF PREFERRED EMBODIMENTS

Applicant's Experiments

Applicant has discovered that the aluminum coating deposited during the replication process, typically about 1 micron thick, is subjected to forces during the subsequent take-apart step of the replication process which tend to generate very small fractures in the aluminum coating and may also contain oxides and hydroxides of aluminum in the grain boundaries. These fractures and grain boundary regions allow small quantities of ultraviolet radiation to leak through to the underlying epoxy when the grating is put into service in an excimer laser. The ultraviolet light which reaches the epoxy causes photodecomposition of the epoxy, releasing gases which cause blisters in the overlying aluminum coating. This blistering greatly increases scatter losses from the reflecting facets of the grating. The ultraviolet light also causes bulk shrinkage of the epoxy, which distorts the original groove shape, causing a loss of reflectivity in the desired diffraction order. These effects severely limit the useful lifetime of the grating, causing unavailability of the equipment in which it is used at relatively frequent intervals.

Applicant has been able to partially solve the problem caused by the cracks in the original aluminum layer of the replica grating by depositing another thin reflective overcoat of aluminum of about 100 nm on the surface of the replica after the replica has been removed from the master and cleaned. The overcoating is preformed in a vacuum chamber by sputtering or evaporation. This overcoat produced a major improvement in the grating performance especially when used for wavelength selection in a KrF excimer laser operating at a wavelength of about 248 nm. However, Applicant has discovered that even with the aluminum overcoat substantial performance degradation occurred when the grating is used for wavelength selection in an ArF excimer laser operating at a wavelength of about 193 nm.

Applicant believes the degradation is due to quantum photochemical and photophysical mechanisms involving high energy UV photon interactions with oxygen in the aluminum film as deposited or at the boundary of the oxide layer which naturally forms on aluminum surfaces when those surfaces are exposed to air after the aluminum coating has been deposited on the grating. This degradation can be accentuated if the UV radiation of the aluminum surface takes place in an environment containing oxygen such as air. However, even if the space over the aluminum surface is purged with nitrogen during periods of UV illumination, reactions with oxygen in $Al_2O_3$ surface films or in the grain boundary regions can degrade performance.

First Preferred Embodiment

Dense Aluminum Coating with $MgF_2$ Overcoat

A first preferred embodiment of the present invention can be described by reference to FIG. 1. This figure describes a method of coating a prior art grating to provide a grating suitable to long term use in high intensity ultraviolet environments.

Figure 2:
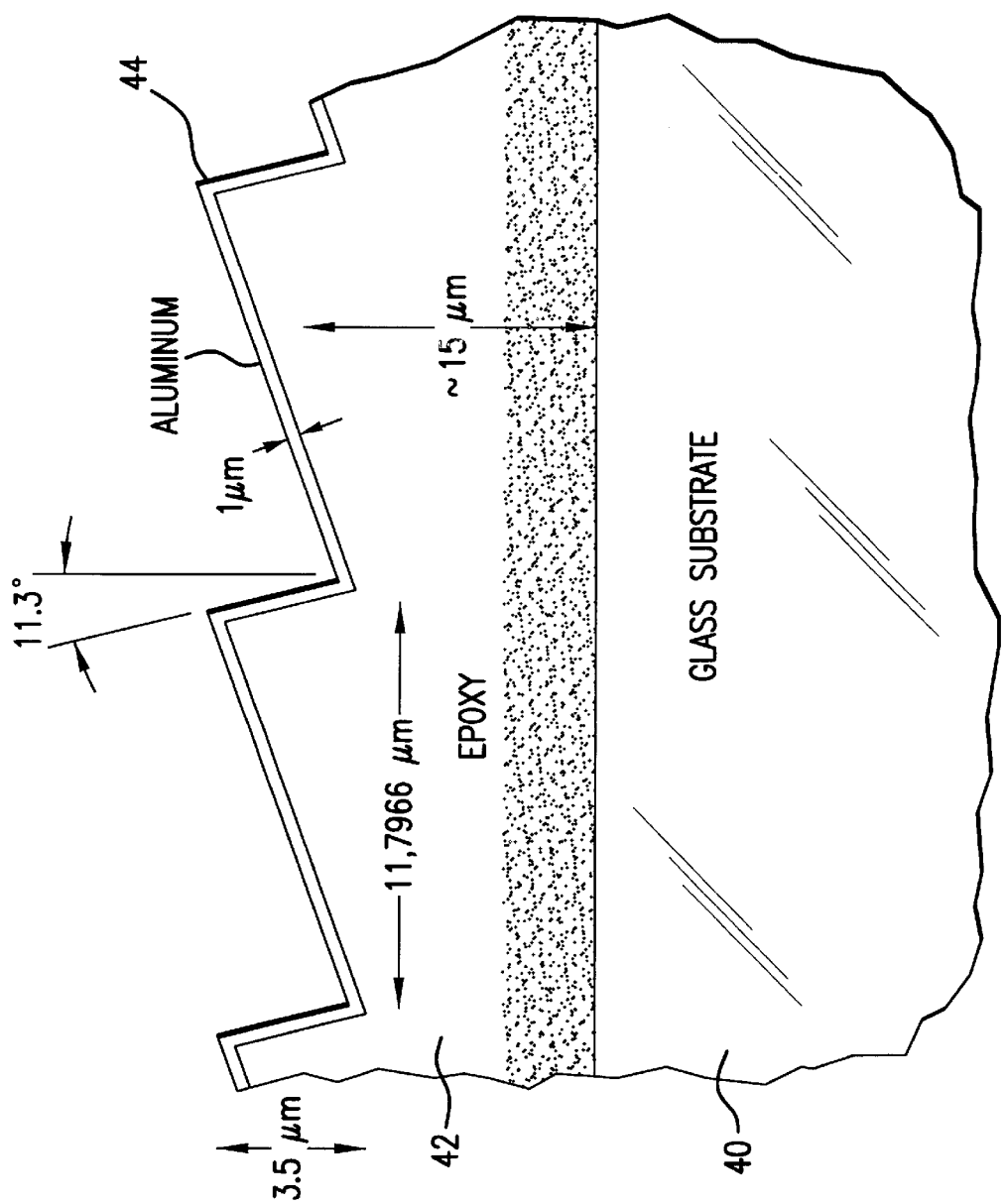
FIG. 2 is a drawing of a section of a prior art replica grating.

Applicant has performed coating operations with a prior art grating having dimensions of about 250 mm in length, 35 mm thick and 35 mm wide. The grooves of this grating are spaced at about 84.77 grooves per mm. FIG. 2 is a drawing of a section of the grating surface. The grating substrate 40 is glass covered by an epoxy layer 42 which is about 15 microns thick which is covered by 1 micron aluminum layer 44. The grooves are spaced at intervals of 11.7966 microns and are triangular shaped and about 3.5 microns deep at the deep end of each groove. The 3.5 micron face of the groove makes a 11.30 angle with the normal to the face of the grating. When used in a Littrow configuration for wavelength selection in a laser, the grating is tilted at 11.3 degrees to the incoming beam so that the incoming beam meets the short surface at 90 degrees. The 3.5 micron face is the reflective face. In an ArF laser operating at a wavelength of 193.38 nm, twice the distance between successive short faces is exactly equivalent to 122 wavelengths of the 193.38 nm ArF light. Twice the distance between the short faces is also exactly equivalent to 95 wavelengths of KrF light at 248.35 nm. Therefore, the same grating can be used for wavelength selection of either KrF lasers or ArF lasers.

Figure 1:
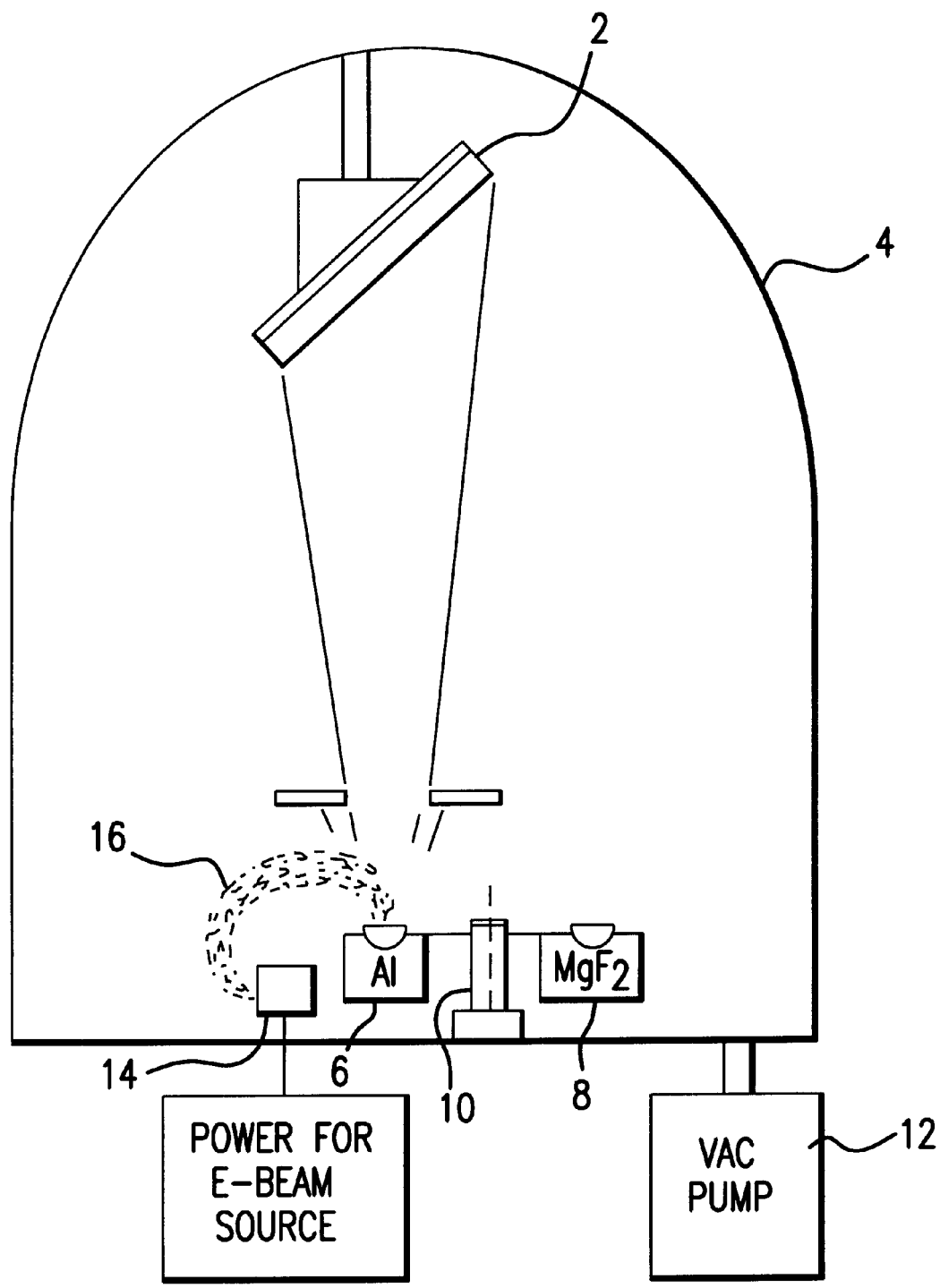
FIG. 1 is a drawing of a vacuum deposition chamber.

Referring now to FIG. 1, prior art replicated grating 2 is mounted in physical vapor deposition vacuum chamber 4 above vapor sources of aluminum metal and magnesium fluoride. Aluminum is contained in an aluminum crucible 6 and magnesium fluoride is contained in a magnesium fluoride crucible 8 both of which are mounted on a rotating support 10 which may be rotated so as to provide a first coating of aluminum and a second coating of $MgF_2$. Vacuum pump 12 provides a vacuum pressure of $10^{-6}$ torr or less, which is sufficient to assure a mean free path several times longer than the distance between the source and the grating. This provides essentially collision free atomic and molecular deposition. Also, at this pressure the collision rate of background gases, such as oxygen or hydrogen, with the surface to be coated is substantially less than the arrival rate of aluminum atoms or magnesium fluoride molecules. This results in the deposition of pure, dense aluminum and magnesium fluoride on the grating surface. There is therefore very little oxygen or hydrogen present within the bulk coating materials. The sources are heated with an electron beam 16 from an electron beam source 14 in the conventional manner, the beam being bent to the crucible location with a magnetic field from a magnetic source (not shown).

Figure 3:
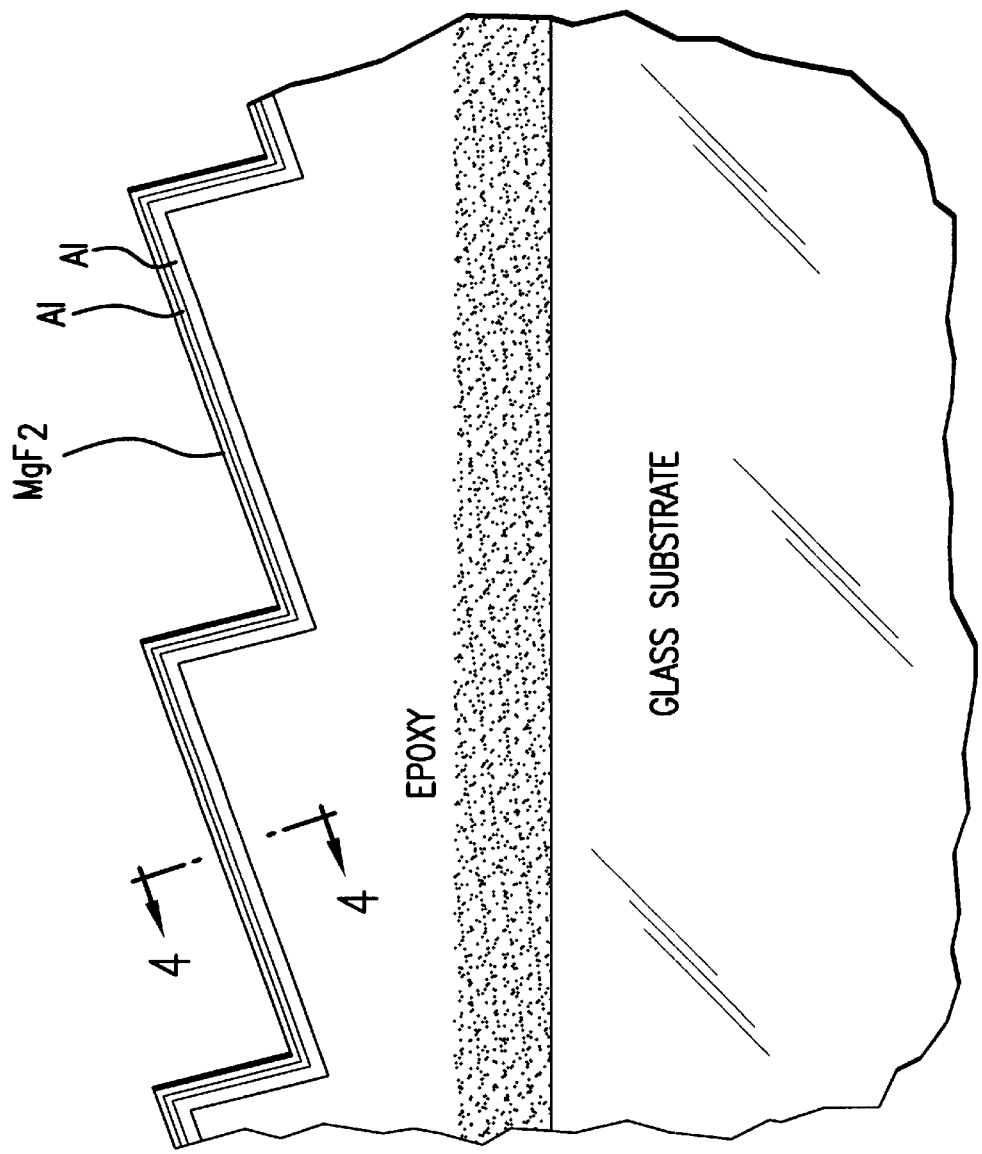
FIG. 3 is a drawing of the same section as shown in FIG. 2 with an overcoat according to an embodiment of the present invention.
Figure 4:
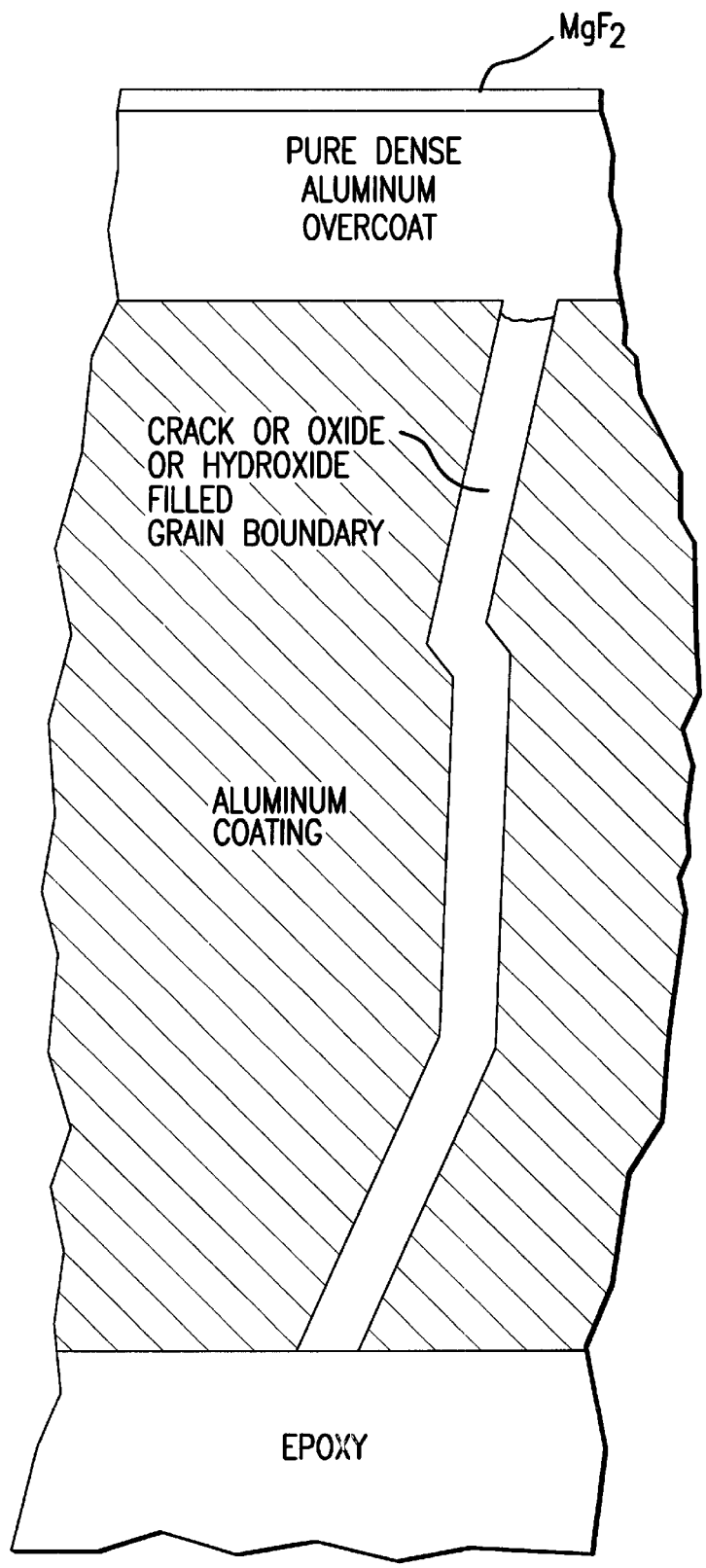
FIG. 4 is a drawing highly enlarged of a section of the section shown in FIG. 3.

To provide the secondary aluminum coating and the $MgF_2$ overcoating, grating 2 is mounted in vacuum chamber 4 at an angle of such that the coating atoms strike the grating surface at an angle of about 50 degrees to the normal. This means that the atoms are impinging on the short surface at an angle of 29 degrees to the normal to the short surface and the long surface at an angle of about 61 degrees to the normal of that surface. The coating process should continue until a dense aluminum thickness of about 100 nm is achieved. Without breaking the vacuum in the chamber 4, the support 10 is used to rotate. the $MgF_2$ source in place and an overcoat of $MgF_2$ of about 54 nm is placed over the aluminum coating on the short surface of the grating. The thicknesses of both coatings on the long surface will be about 55% of the corresponding thickness on the short surface. The result of the double coating is shown in FIGS. 3 and 4.

Test Results

Gratings overcoated in accordance with the dense aluminum and $MgF_2$ overcoat have been tested by Applicant in wavelength selecting modules on an ArF laser and compared to prior art non-densely unovercoated gratings.

Figure 5:
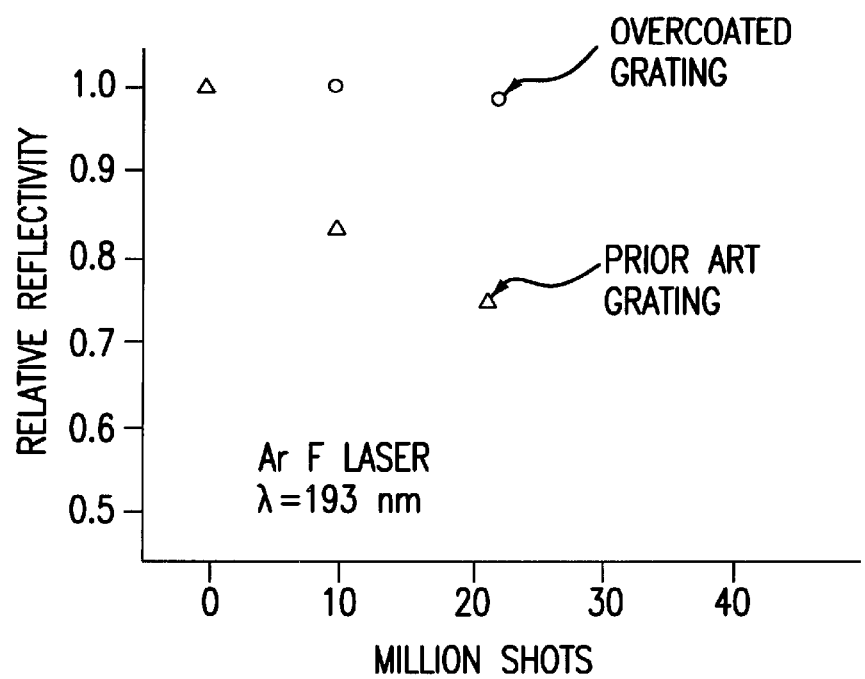
FIG. 5 is a graph of test data showing a performance comparison of an overcoated grating with a prior art grating.
Figure 7:
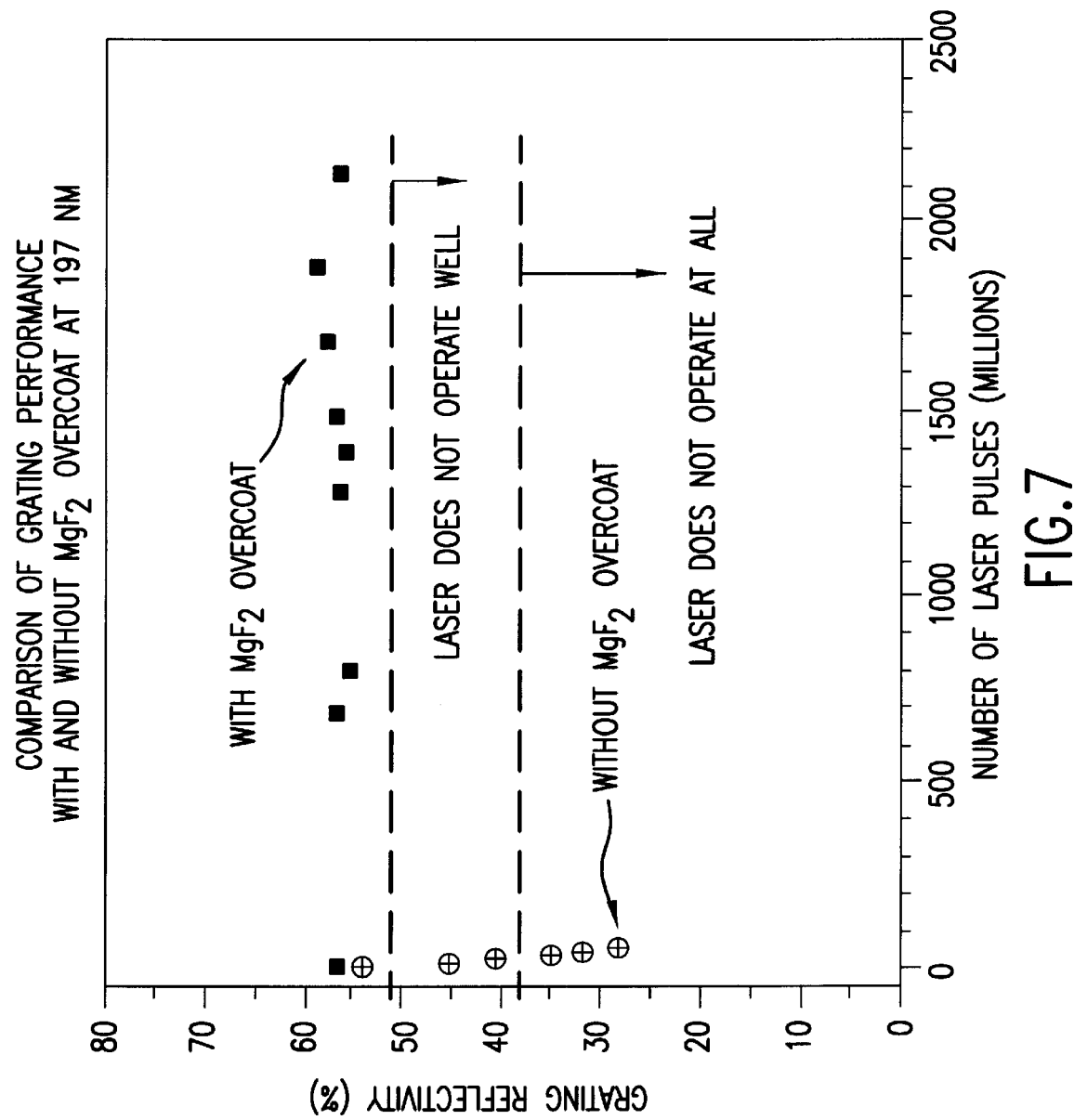
FIG. 7 shows performance data using a grating coated with a dense Al layer and $MgF_2$.

Data from the ArF experiment is shown in FIG. 5. After about 20 million pulses at 10 mJ per pulse at 193 nm the prior art grating has decreased in reflectivity to about 75% of its initial value; whereas the grating overcoated in accordance with the present invention still provides a reflectivity of more than 95% of its initial value. FIG. 7 presents data showing that the single coating of $MgF_2$ provides excellent results up to about 2 billion pulses. However, Applicants' continued tests have shown that the gratings deteriorate rapidly after about 2 billion pulses.

Applicants have noted that deterioration begins in the higher flux regions of the grating indicating that the deterioration after 2 billion pulses is due to accumulated UV radiation. Applicants suspect that the radiation causes tiny cracks in the $MgF_2$ which grow over time permitting UV assisted oxidation of the underlying pure dense aluminum overcoat.

Other Coatings

Although the $MgF_2$ coating shown in FIGS. 3 and 4 provides a tremendous lifetime improvement for the gratings in an ArF laser LNP, other coatings in the place of or in addition to the $MgF_2$ are needed to protect the grating surface from degradation beyond about 2 billion pulses. Furthermore, Applicants have discovered that substantial improvements in reflectivity can result from use of multiple coatings.

Coating Thickness to Improve Reflectivity

Pure aluminum has maximum reflection coefficient of about 92.5% at 193 nm. Although this is a sufficient reflectivity for some applications, it is sometimes desirable to increase the reflectivity even more. One such application is using grating in high power excimer lasers. Higher reflectivity would not only make these lasers work more efficiently, but also it will reduce percentage of laser power, which is absorbed by the grating surface. In case of aluminum surface discussed above, a maximum of 92.5% of light at 193 nm is reflected, but the rest 7.5 % of light is absorbed. The state of the art excimer lasers may have 10–20 W of light power going onto the grating during operation. Absorbing 7.5% of this power will cause grating surface to heat up. That, in turn, might cause significant distortions in the properties of the laser beam, generated by these lasers, such as spectral bandwidth, divergence, and even shape and size of the laser beam. These distortions can even make those lasers not suitable for microlithography exposure and force a reduction in power, thus reducing the microlithography throughput and increasing the cost of the integrated circuits. Therefore, it is desirable to increase the reflectivity of the grating surface.

The reflectivity of the Al surface can be increased if it is overcoated with one or several layers of dielectric materials, such as $MgF_2$, $Al_2O_3$, $SiO_2$ and others. In this case, the aluminum surface is coated with alternating layers of high and low refractive index materials. As a low refractive index materials, $MgF_2$ and $SiO_2$ can be used. $Al_2O_3$, on the other hand, is an example of high refractive index material.

Figure 9A:
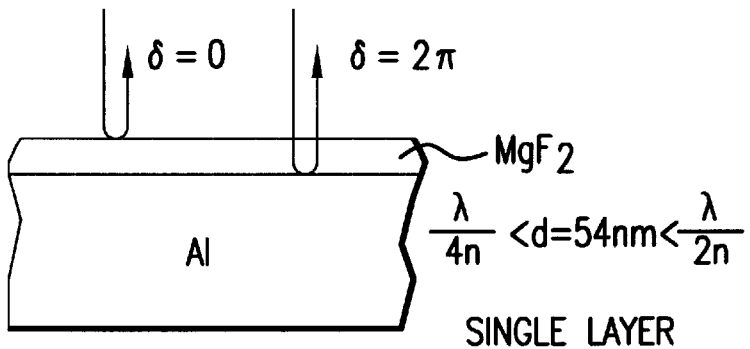
FIGS. 9A, B and C show reflections in phase through protective coatings.
Figure 9B:
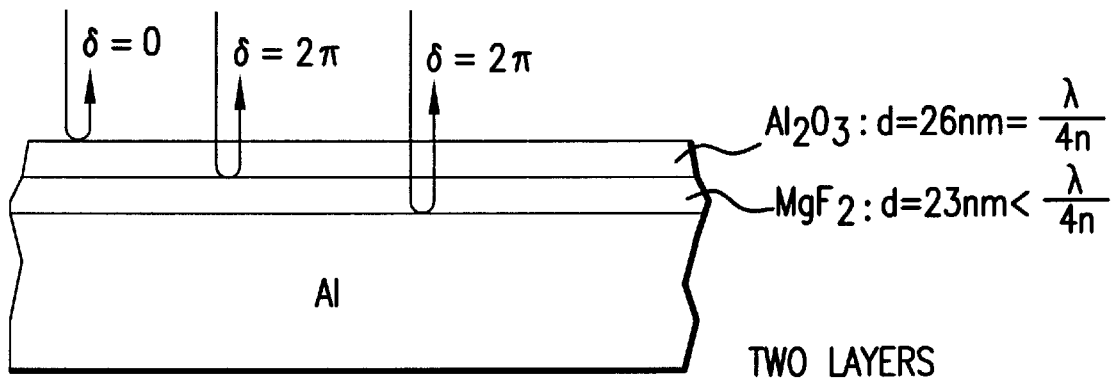
Figure 9C:
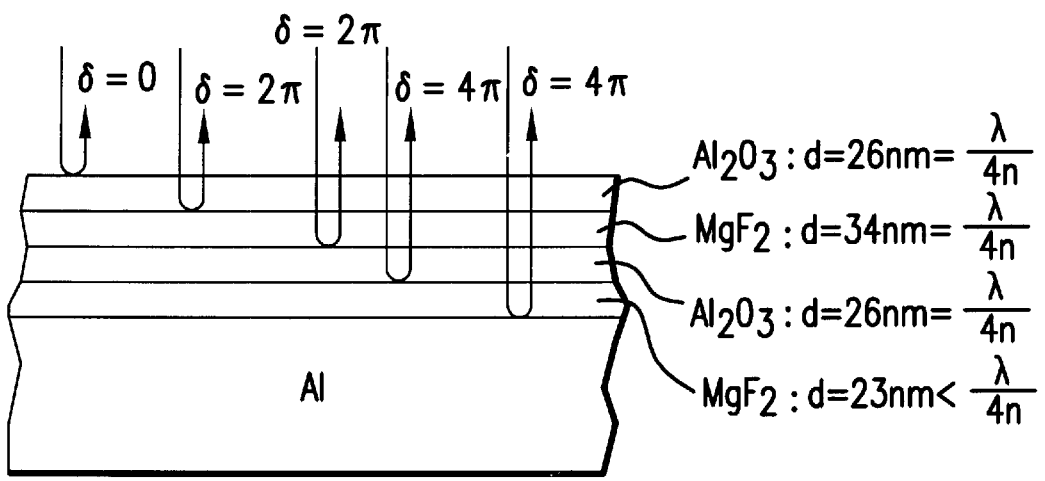

The coating thicknesses are chosen in such a way, that reflections from each layer are all in phase with each other, so that total reflection is thus increased. Being in phase means that the phase differences of these reflection waves are the whole number of $2\pi$ radians. FIGS. 9A, 9B and 9C show the overcoat structure for one, two and four layer overcoats. In the design of these coatings, all layers, except for the layer next to aluminum surface, have geometrical thickness of about $\lambda/4 \cdot n$, where n is refractive index of layer material, and $\lambda$ is the wavelength. This thickness means that the light traveling through this layer twice will have a phase shift of $\pi$. This fact and the fact that the light has an addition phase shift of $\pi$ when reflecting from the interface of high and low refractive index materials, if it is coming from the high refractive index side, and a phase shift of zero, if it is coming from the low refractive index side; provides that the phase difference of all reflected waves is a whole number of $2\pi$, that means they are all interfere constructively, thus increasing overall reflectivity.

As for the first layer on aluminum surface, its thickness is less than $\lambda/4n$ in case of 2 and 4 layer designs, because phase shift is between 0 and $\pi$ in the interface of this layer and Al surface. Similarly, the thickness of a single layer of $MgF_2$ in a single layer design is between $\lambda/4n$ and $\lambda/2n$.

Readers are referred to numerous optical references which explain in detail techniques for choosing these coating thicknesses to achieve maximum reflectance. Specifically, a recommended reference is Chapter 40 of Handbook of Optics, Volume I, pages 42-1 to 42-54, published by McGraw Hill with offices in New York and many other cities. The editor-in-chief is Michael Bass.

By doing a single layer $MgF_2$ overcoat the reflectivity of the aluminum surface can be slightly increased. For example, overcoating Al with 54 nm thick $MgF_2$ layer can increase its reflectivity up to 93.2 %. It is desirable to increase the reflectivity even more. For that, a multilayer overcoat can be used. This overcoat consists of alternating layers of high and low refractive index materials. A two layer overcoat, having 23 nm thick $MgF_2$ layer as a first layer on top of Al surface, and a 26 nm thick layer of $Al_2O_3$ on top of $MgF_2$ will boast the total reflectivity at 193 nm to about 95.5%. Even higher reflectivity can be achieved using a four layer overcoat such as this:

Air
26 nm thick $Al_2O_3$
34 nm thick $MgF_2$
26 nm thick $Al_2O_3$
23 nm thick $MgF_2$
Aluminum.

Figure 8:
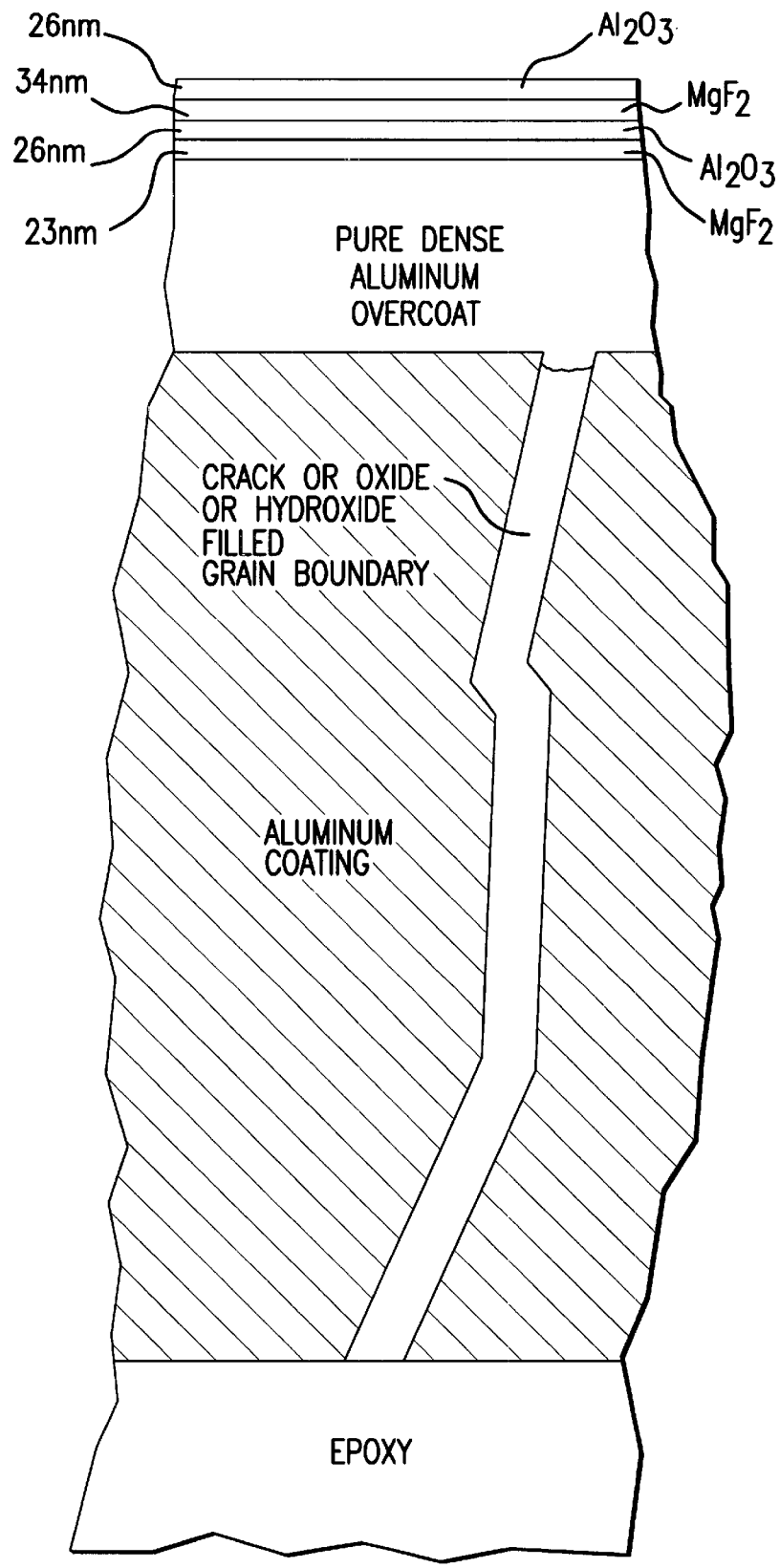
FIG. 8 shows a four layer protective coating designed for improved reflectivity.

This coating shown in FIG. 8 will have a total reflectivity of about 97.1% at 193 nm. In all these coatings, $MgF_2$ is used as a low refractive index material.(n=1.43), while $Al_2O_3$ is used as a high refractive index material (n=1.8). Persons skilled in the art can recognize, that other high and low refractive index materials can be used.

The advantage of this multilayer overcoat is that the total dielectric film thickness is rather small: about 48 nm in case of two layer overcoat and about 109 nm in case of four layer overcoat. Therefore, it is significantly smaller than the size of the groove which is typically somewhat larger than 3,000 nm. The increase of total reflectivity from about 92.5% (uncoated Al) to 97.1% (four layer overcoated Al) is very important, especially if this coating is used on a grating working in high average power UV laser, such as excimer lithography laser.

Al coating absorbs all the light which was not reflected. That means, in case of uncoated aluminum 100%–92.5%=7.5% of incident light is absorbed. On the other hand, in case of four layer overcoat, only 100–97.1%=2.9% of incident light is absorbed. Therefore, by increasing total reflectivity from 92.5% to 97.1% we actually reduced absorption by 7.5% divided by 2.9 % equals 2.59 times. Reduction of total power absorbed by the diffraction grating is very important, as it reduces all the thermal effects and thermal distortions in the properties of the laser beam caused by bulk heating of the grating, because these effects are normally proportional to the absorbed power.

Other techniques for the application of multiple layers for enhancing normal reflectivity may be utilized to increase normal reflectivity as compared to an uncoated aluminum surface. A very important feature of this invention is that the coatings are chosen to accomplish two purposes (1) protect the grating surface from ultraviolet caused degradation and (2) improve normal reflectivity from the reflecting grating faces. This improvement in reflectivity has two very important effects: (1) greater reflectivity increases the efficiency of the grating and improves laser overall performance and (2) greater reflectivity means that less light energy is absorbed to the grating surface reducing the thermal load on the grating which can cause temperature increases and resulting distortion of the surface which could in turn adversely affect performance of the grating.

$MgF_2$ and $Al_2O_3$

A single coating of $Al_2O_3$ 24 nm thick may be applied over a 23 nm thick $MgF_2$ coating as discussed above.

Preferably the $Al_2O_3$ is applied by adding an $Al_2O_3$ crucible on the rotating support 10 shown in FIG. 1. $Al_2O_3$ is much tougher than $MgF_2$. It protects the $MgF_2$ from UV damage and improves reflectivity as described above. FIG. 8 shows the four layer coating discussed above which is 23 nm $MgF_2$, 26 nm $Al_2O_3$, 34 nm $MgF_2$ and 26 nm $Al_2O_3$.

$MgF_2$ and $SiO_2$

Coatings of $SiO_2$ over the $MgF_2$ may be applied as described above for the $Al_2O_3$ with similar results. $SiO_2$ is a glass, and so less brittle than $MgF_2$ and, as the $Al_2O_3$, protects the $MgF_2$ from UV damage, extending the useful life of the grating. Thin films of $SiO_2$ are also transparent to the UV radiation. Standard well known techniques needed to select thicknesses for optimum reflectivity performance may be used to specify thicknesses.

Importance of Dense Non-Oxidized Al Overcoat

Figure 6:
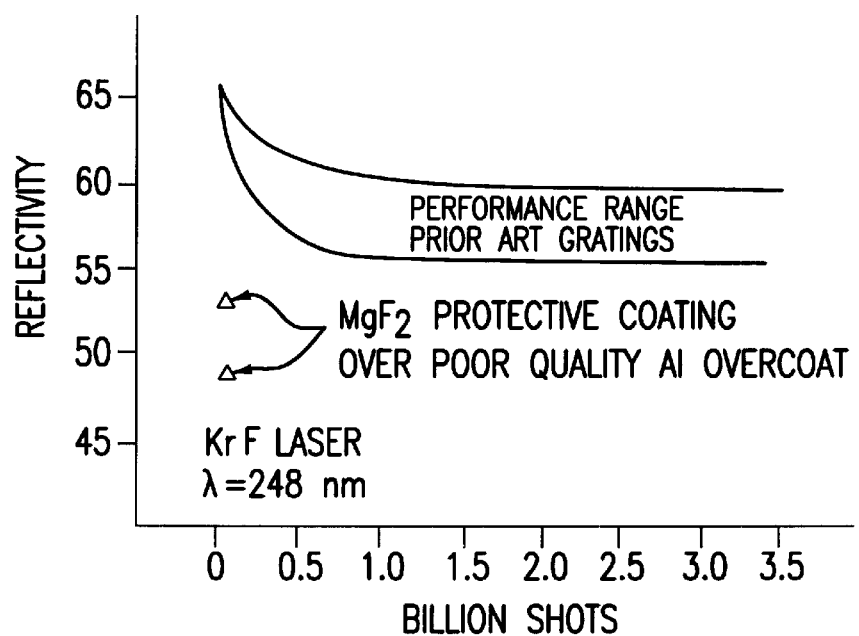
FIG. 6 is a graph showing unsatisfactory performance of a prior art grating overcoated with non-dense aluminum an then $MgF_2$.

It is important that the aluminum overcoating be a pure dense coat of aluminum and that the coating is free of oxidation. Merely coating the original cracked and/or non-dense coating on the prior art grating with $MgF_2$ provides no substantial improvement. In fact, experiments by Applicant in a 248 nm environment showed poor initial performance and rapid degradation of a grating having a $MgF_2$ coating but with an aluminum overcoat applied at a vacuum pressure higher than $10^{-5}$ torr, see FIG. 6. It is also important as stated above to put the $MgF_2$ coating on the aluminum overcoat before there is any significant oxidation of the aluminum overcoat. If there is an oxide film on the aluminum, the UV will cause chemical changes below the $MgF_2$ layer and distort the grating surface, thus reducing reflectivity. It should be noted that the requirement for a pure dense aluminum coat is not normally important when the grating is used in environments where the UV intensity is low, such as in astronomy work. The pure dense aluminum coating, however, is very important at high UV levels such as those produced by excimer lasers.

While particular embodiments of the present invention have been shown and described, it will be obvious to those skilled in the art that changes and modifications may be made without departing from this invention in its broader aspects. For example, persons skilled in the art will understand that methods other than vacuum evaporation could be used to produce an oxide-free, dense aluminum overcoat. Many different combinations of layers of various thicknesses could be utilized to achieve the two important objectives of this invention, i.e. surface protection and increased reflectivity. Preferred thicknesses for the aluminum coat are from about 50 nm to about 200 nm. The single $MgF_2$ layer could be replaced with a layer of either $SiO_2$, $Al_2O_3$, $GdF_3$ or $AlF_3$. Preferably, the total thickness of the protective layer or layers is less than 10% of the width of the reflecting face of the grating. However, thicknesses outside these ranges may be specified. It is most important that good coatings be applied to the surface which will be exposed to the intense ultraviolet light. For the grating shown in FIGS. 2 and 3, that surface is the short, 3.5 micron surface. The test results discussed above were obtained using a wavelength selecting module containing a three-prism beam expander, and a beam angle adjusting mirror along with the overcoat material diffraction grating arranged in a Littrow configuration. However, persons skilled in the art will recognize many other applications for gratings fabricated according to the present invention. Therefore, the appended claims are to encompass within their scope all such changes and modifications as fall within the true spirit and scope of this invention.

What is claimed is:

1. An overcoat protected diffraction grating having a large number of parallel grooves, each groove having a reflective face, said grating comprising:
   A. a rigid substrate;
   B. an aluminum grating layer comprising a very large number of parallel grooves; spaced apart by about 11.7966 microns;
   C. an adhesive layer affixing said aluminum grating layer to said rigid substrate;
   D. a thin album overcoat layer overcoating said aluminum grating layer, said aluminum overcoat layer having a thickness of less than 200 nm on said reflective faces;
   D. a protective layer comprised of one or more layers of dielectric material, overcoating said aluminum overcoat layer;
   wherein said protective layer or layers have a thickness or thicknesses chosen to increase normal reflectivity of said reflecting face of each groove.

2. An overcoat protected diffraction grating having a large number of parallel grooves, each groove having a reflective face, said grating comprising:
   A. a rigid substrate;
   B. an aluminum grating layer comprising a very large number of parallel grooves;
   C. an adhesive layer affixing said aluminum grating layer to said rigid substrate;
   D. a thin aluminum overcoat layer overcoating said aluminum grating layer, said aluminum overcoat layer having a thickness of less than 200 nm on said reflective faces;
   E. a protective layer comprised of one or more layers of dielectric material, overcoating said aluminum overcoat layer, wherein said protective layer is comprised of a layer of $MgF_2$ about 23 nm thick overcoated with a layer of $Al_2O_3$ about 26 nm thick;
   wherein said protective layer or layers have a thickness or thicknesses chosen to increase normal reflectivity of said reflecting face of each groove.

3. An overcoat protected diffraction grating having a large number of parallel grooves, each groove having a reflective face, said grating comprising:
   A. a rigid substrate;
   B. an aluminum grating layer comprising a very large number of parallel grooves;
   C. an adhesive layer affixing said aluminum grating layer to said rigid substrate;
   D. a thin aluminum overcoat layer overcoating said aluminum grating layer, said aluminum overcoat layer having a thickness of less than 200 nm on said reflective faces;
   E) a protective layer comprised of one or more layers of dielectric material, overcoating said aluminum overcoat layer; wherein said protective layer is comprised of a first layer of $MgF_2$ about 23 nm thick a second layer of $Al_2O_3$ about 26 nm thick, a third layer of $MgF_2$ about 34 nm thick and a fourth layer of $Al_2O_3$ about 26 nm thick;
   wherein said protective layer or layers have a thickness or thicknesses chosen to increase normal reflectivity of said reflecting face of each groove.

* * * * *

UNITED STATES PATENT AND TRADEMARK OFFICE
CERTIFICATE OF CORRECTION

PATENT NO. : 6,529,321 B2
APPLICATION NO. : 09/731938
DATED : March 4, 2003
INVENTOR(S) : Pan et al.

It is certified that error appears in the above-identified patent and that said Letters Patent is hereby corrected as shown below:

<u>Column 8</u>:
Line 12, "album" should be changed to --aluminum--.

Signed and Sealed this

Thirty-first Day of July, 2007

JON W. DUDAS
*Director of the United States Patent and Trademark Office*